United States Patent
Schmidt et al.

(10) Patent No.: US 10,901,448 B2
(45) Date of Patent: Jan. 26, 2021

(54) SYSTEMS AND METHODS FOR MODIFYING INPUT VOLTAGE RECEIVED BY A CONTROL PANEL

(71) Applicant: Ademco Inc., Golden Valley, MN (US)

(72) Inventors: Mark H. Schmidt, West Islip, NY (US); Sandro Chilelli, Massapequa Park, NY (US); Thomas Winkeler, Saint James, NY (US)

(73) Assignee: Ademco Inc., Golden Valley, MN (US)

( * ) Notice: Subject to any disclaimer, the term of this patent is extended or adjusted under 35 U.S.C. 154(b) by 0 days.

(21) Appl. No.: 15/848,747

(22) Filed: Dec. 20, 2017

(65) Prior Publication Data

US 2019/0187740 A1 Jun. 20, 2019

(51) Int. Cl.
| | | |
|---|---|---|
| *G05F 5/00* | (2006.01) | |
| *G08B 21/18* | (2006.01) | |
| *G01R 19/165* | (2006.01) | |
| *G08B 29/18* | (2006.01) | |
| *H02M 7/02* | (2006.01) | |
| *H02M 3/156* | (2006.01) | |

(52) U.S. Cl.
CPC .............. *G05F 5/00* (2013.01); *G01R 19/165* (2013.01); *G08B 21/182* (2013.01); *G08B 29/181* (2013.01); *H02M 3/156* (2013.01); *H02M 7/02* (2013.01)

(58) Field of Classification Search
CPC .... H02M 3/156; H02M 3/158; H02M 3/1584; H02M 3/1588; H02M 7/02; Y02B 70/1466; G05F 5/00; G01R 19/165; G08B 21/182
USPC ....................................... 323/282
See application file for complete search history.

(56) References Cited

U.S. PATENT DOCUMENTS

| | | |
|---|---|---|
| 4,083,039 A | 4/1978 | Simon |
| 5,686,896 A | 11/1997 | Bergman |
| 6,628,014 B2 | 9/2003 | Borup |
| 9,590,510 B1 | 3/2017 | Sheng et al. |
| 9,712,052 B2 | 7/2017 | Lu |
| 2008/0272654 A1* | 11/2008 | Lontka ................... G08B 25/14 307/65 |

(Continued)

FOREIGN PATENT DOCUMENTS

| | | |
|---|---|---|
| EP | 3 151 210 A1 | 4/2017 |
| WO | 2013/019659 A1 | 2/2013 |

OTHER PUBLICATIONS

7SG15—MicroTAPP—Automatic Voltage Control, Siemens Protection Devices Limited, www.siemens.com/energy, electronically retrieved Oct. 10, 2017.

(Continued)

*Primary Examiner* — Shawki S Ismail
*Assistant Examiner* — Monica Mata
(74) *Attorney, Agent, or Firm* — Fredrikson & Byron, P.A.

(57) ABSTRACT

Systems and methods for measuring and modifying an input voltage provided to a control panel are provided. Some systems can include measuring the input voltage provided by a power supply, determining whether the input voltage is within a range of acceptable input voltages, transmitting, to the power supply, a modulated signal on a direct current line between the power supply and the control panel instructing the power supply to modify the input voltage, and generating a notification when the input voltage is outside of the range of acceptable input voltages.

20 Claims, 3 Drawing Sheets

(56) References Cited

U.S. PATENT DOCUMENTS

| | | | |
|---|---|---|---|
| 2009/0204852 A1* | 8/2009 | Diggs | G06F 11/008 714/42 |
| 2010/0008117 A1* | 1/2010 | Luthi | H02J 9/005 363/126 |
| 2010/0237695 A1* | 9/2010 | Covaro | H04B 3/548 307/19 |
| 2015/0221211 A1 | 8/2015 | Barrieau et al. | |

OTHER PUBLICATIONS

Extended European search report from corresponding EP patent application 18203420.7, dated Apr. 30, 2019.

* cited by examiner

SYSTEMS AND METHODS FOR MODIFYING INPUT VOLTAGE RECEIVED BY A CONTROL PANEL

FIELD

The present invention relates generally to security systems. More particularly, the present invention relates to systems and methods for providing an acceptable input voltage to a security system control panel.

BACKGROUND

Security systems are known to detect threats within a secured area, and such threats include events that represent a risk to human safety or a risk to assets.

Security systems typically include one or more security sensors that detect the threats within the secured area. For example, smoke, motion, and/or intrusion sensors are distributed throughout the secured area in order to detect the threats.

Some security systems cannot replace an old control panel with a new control panel having newer technologies (e.g. wireless capabilities or a touch screen) in premises with preexisting wiring (e.g. 22 American Wire Gauge (AWG) 4 telephone conductor wire) due to limitations of the preexisting wiring. For example, a low gauge or long length of the preexisting wiring has been known to cause a voltage drop from a power supply to the control panel. As a result of the voltage drop, the control panel may not receive a minimum required input voltage to operate, and the control panel may fail to charge a battery, may operate intermittently, or may fail to operate completely.

As such, there exists a need in the art to ensure that the control panel of the security system receives an acceptable input voltage from the power supply.

DETAILED DESCRIPTION

Figure 1:
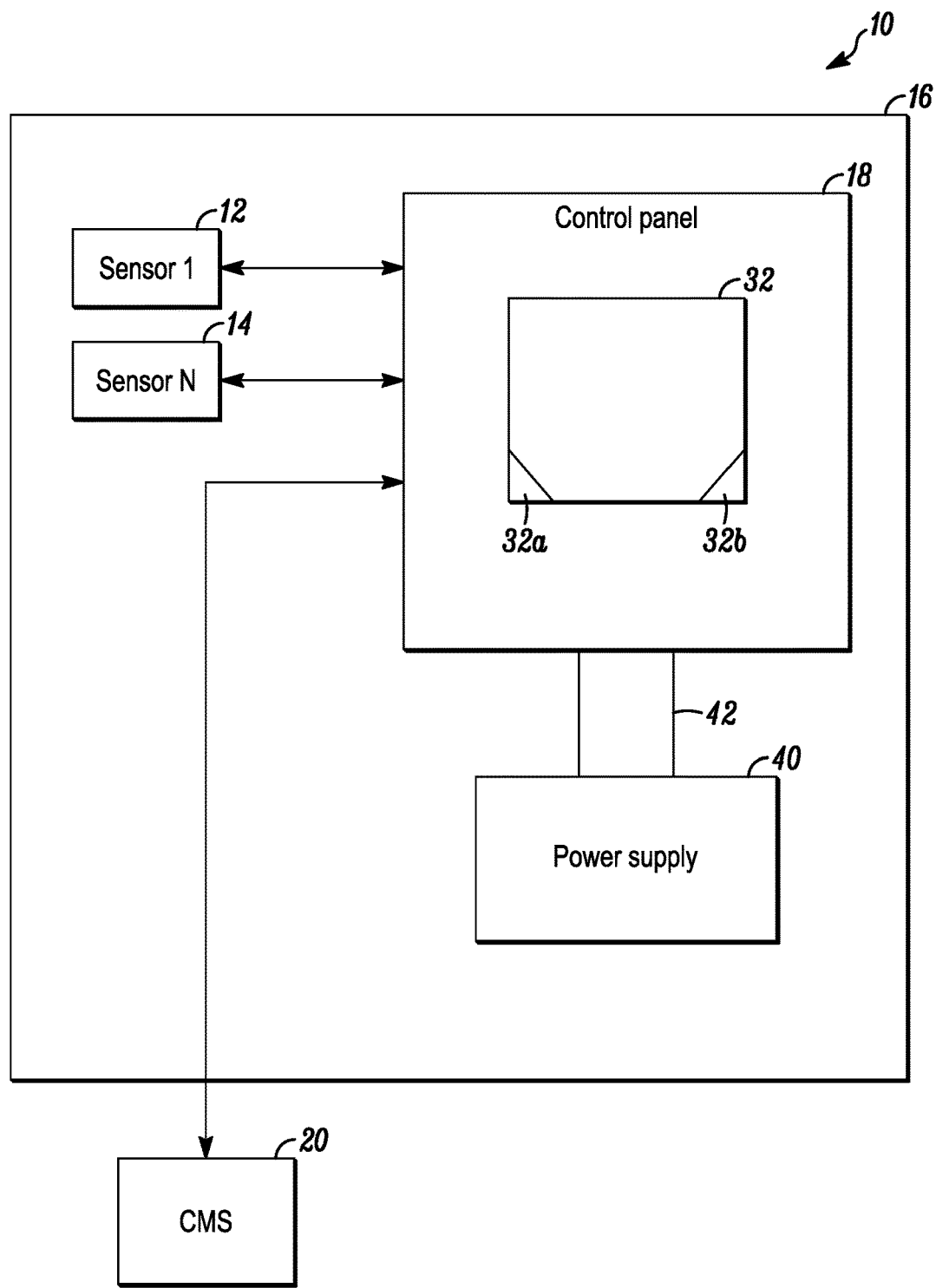
FIG. 1 is a block diagram of a system in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include systems and methods for measuring and modifying an input voltage received by a control panel of a security system from a power supply. For example, in some embodiments, the control panel can measure the input voltage provided to the control panel or detect that the input voltage is outside of an acceptable range (e.g. the input voltage is too high or low). Furthermore, in some embodiments, the control panel can notify a user that the input voltage is outside of the acceptable range. Alternatively or additionally, in some embodiments, the control panel can automatically transmit a signal to the power source requesting a modification to the input voltage.

In some embodiments, the signal transmitted to the power source may be a modulated signal on a direct current (DC) line. Furthermore, in some embodiments, the modulated signal may represent a single, digital bit (e.g. 0 or 1), and the single, digital bit can indicate to the power supply whether to increase the input voltage by a predetermined amount (e.g. 100 mV) or to decrease the input voltage by the predetermined amount. Alternatively, in some embodiments, the modulated signal can represent a multiple bit, digital signal indicating an amount by which the power supply should increase or decrease the input voltage.

FIG. 1 is a block diagram of a security system 10 in accordance with disclosed embodiments. As seen in FIG. 1, the security system 10 can include one or more wireless security sensors 12, 14 that monitor a secured area 16 for threats, and in some embodiments, the wireless security sensors 12, 14 can include intrusion, camera, motion, fire, smoke, and gas detectors. The wireless security sensors 12, 14 can communicate with a control panel 18, and the control panel 18 can monitor for activation of the wireless security sensors 12, 14.

In some embodiments, the control panel 18 may send an alarm message to a central monitoring station 20 upon the activation of one of the wireless security sensors 12, 14, and the central monitoring station 20 may respond by summoning the appropriate help. For example, if the one of the wireless security sensors 12, 14 detects a fire, then the central monitoring station 20 may summon a local fire department. Alternatively, if the one of the wireless security sensors 12, 14 detects an intrusion, then the central monitoring station 20 may summon the police.

The control panel 18 can include control circuitry 32, which can include one or more programmable processors 32a and executable control software 32b as would be understood by one of ordinary skill in the art. The executable control software 32b can be stored on a transitory or non-transitory computer readable medium, including, but not limited to local computer memory, RAM, optical storage media, magnetic storage media, and the like. In some embodiments, the control circuitry 32, the programmable processor 32a, and the control software 32b can execute and control some of the methods disclosed herein.

The security system 10 can also include a power supply 40 that can provide an input voltage to the control panel 18 to power the control panel 18. The power supply 40 can be connected to the control panel 18 through wiring 42, which can include preexisting wiring or wiring from a previously-installed security system. In some embodiments, the power supply 40 can convert alternating current (AC) to DC current. Furthermore, in some embodiments, the power supply 40 can be installed at a fuse box within the secured area 16 or at a wall outlet within the secured area 16.

Figure 2:
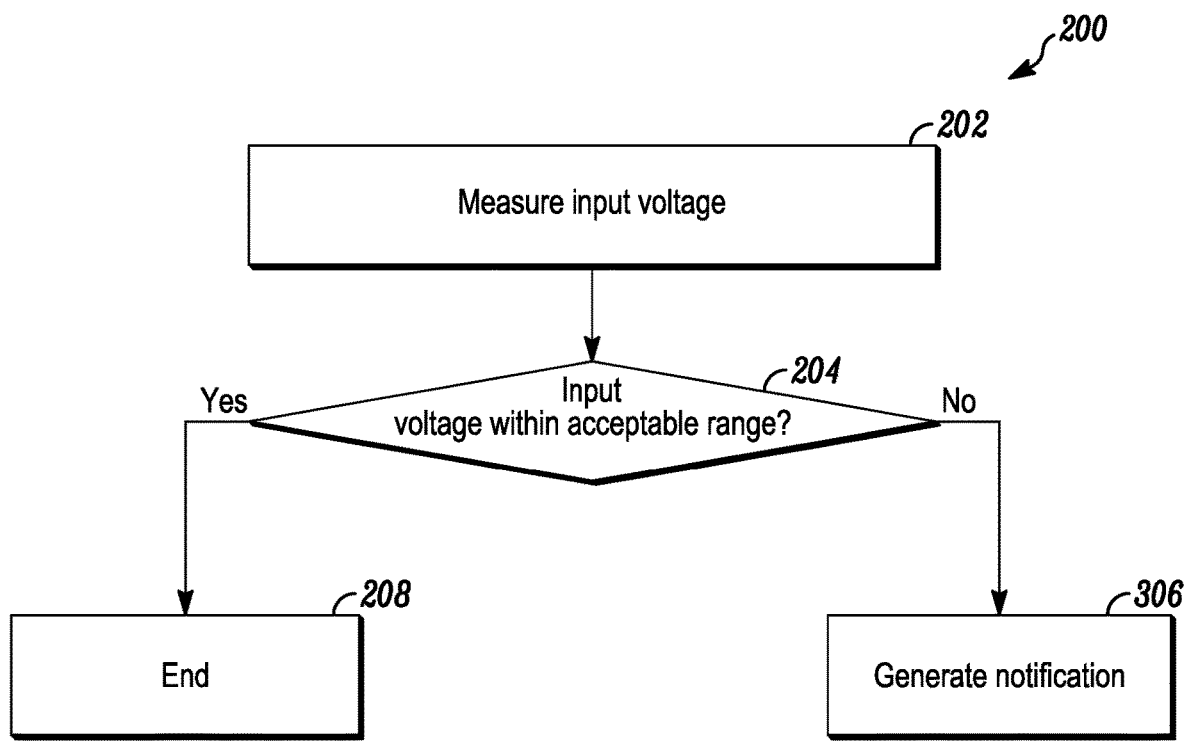
FIG. 2 is a flow diagram of a method in accordance with disclosed embodiments.

FIG. 2 is a flow diagram of a method 200 for determining whether an input voltage is within an acceptable range of input voltages in accordance with disclosed embodiments. As seen in FIG. 2, the method 200 can include a processor (e.g. the programmable processor 32a) measuring the input voltage (e.g. measuring the input voltage on the wiring 42) provided to a control panel (e.g. the control panel 18) as in 202, and the processor determining whether the input voltage is within the acceptable range of input voltages as in 204. For example, the processor can determine whether the input voltage is within the acceptable range of input voltages by comparing the measured input voltage to a pre-stored range. When the processor determines that the input voltage is outside of the acceptable range of input voltages, the processor can generate a notification as in 206. However, when the processor determines that the input voltage is within the acceptable range of input voltages, the method 200 can end as in 208. In some embodiments, the processor can execute the method 200 during installation of the control panel. Alternatively or additionally, in some embodiments, the processor can execute the method 200 at periodic, regular intervals to ensure that the control panel is continuing to receive an acceptable input voltage.

The control panel can present the notification generated as in 206 via one or more user interface devices. For example, the control panel can present the notification visually via an activated trouble condition light or aurally via an activated speaker. Additionally or alternatively, when the control panel includes a display device, such as a touch-sensitive display device, the control panel can display a pop-up warning indicative of the notification on the display device. Furthermore, in some embodiments, the pop-up warning can include step-by-step guidance to a user or an installer for fixing the input voltage problem and finding a solution, such as, for example, instructions for manually increasing or decreasing the input voltage supplied to the control panel by a power supply (e.g. the power supply 40), an identification of an amount by which the input voltage should be increased or decreased to fix the input voltage problem, or images illustrating proper methods to connect a wiring kit to a transformer. Additionally or alternatively, the pop-up warning can include a URL to a website via which the user can buy the wiring kit to replace existing wiring. For example, the wiring kit can include the Honeywell LT-CABLE, which includes 18 AWG 2 conductor cable designed to make a connection between the transformer and the control panel.

Figure 3:
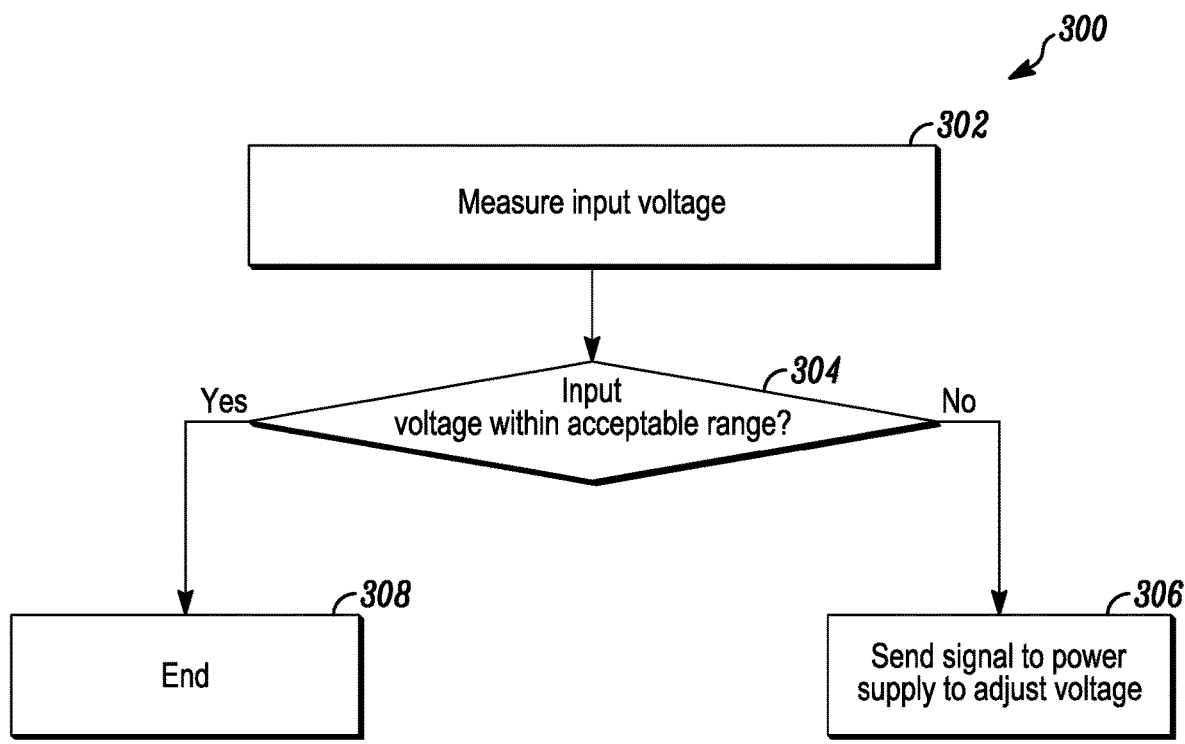
FIG. 3 is a flow diagram of a method in accordance with disclosed embodiments.

FIG. 3 is a flow diagram of a method 300 for automatically modifying an input voltage provided to a control panel in accordance with disclosed embodiments. As seen in FIG. 3, the method 300 can include a processor (e.g. the programmable processor 32a) measuring the input voltage (e.g. measuring the input voltage on the wiring 42) provided to the control panel (e.g. the control panel 18) as in 302, and the processor determining whether the input voltage is within an acceptable range of input voltages as in 304. When the processor determines that the input voltage is outside of the acceptable range of input voltages, the processor can send a signal to a power supply to adjust the input voltage as in 306. For example, in some embodiments, the processor can send the signal to the power supply via preexisting wiring (e.g. the wiring 42). However, when the processor determines that the measured input voltage is within the acceptable range of input voltages, the method 300 can end as in 308. In some embodiments, the control panel can executed the method 300 during installation of the control panel. Alternatively or additionally, in some embodiments, the processor can execute the method 300 at periodic, regular intervals to ensure that the control panel is continuing to receive an acceptable input voltage.

In some embodiments, the signal sent to the power supply as in 306 can be a modulated signal on a DC line between the power supply and the control panel (e.g. the wiring 42). For example, in some embodiments, the modulated signal can represent a single bit value (e.g. 1 or 0), and the single bit value can indicate whether the power supply should increase the input voltage by a predetermined amount or decrease the input voltage by the predetermined amount. In some embodiments, the predetermined amount can be 100 mV, and in some embodiments, the control panel can send a plurality of modulated signals to the power supply when the input voltage should be increased or decreased by more than the predetermined amount.

Alternatively, in some embodiments, the signal sent to the power supply as in 306 can be a multiple bit, digital signal indicating an amount by which the power supply should increase or decrease the input voltage. The power supply can interpret the multiple bit, digital signal and adjust the input voltage by the amount indicated in the multiple bit, digital signal. For example, if the multiple bit, digital signal has a digital value of 230, then the power supply can increase the input voltage by 230 mV. In some embodiments, the digital value of the digital signal can be indicated with a plurality of modulations on the DC line.

As shown in FIG. 3, adjusting the input voltage provided to the control panel can be completely automatic. Indeed, an installer may be unaware that an adjustment occurred during the installation of the control panel. However, in some embodiments, the control panel may display a notification when the control panel is unable to adjust the input voltage or adjust the input voltage enough so as to reach an acceptable input voltage value.

Figure 4:
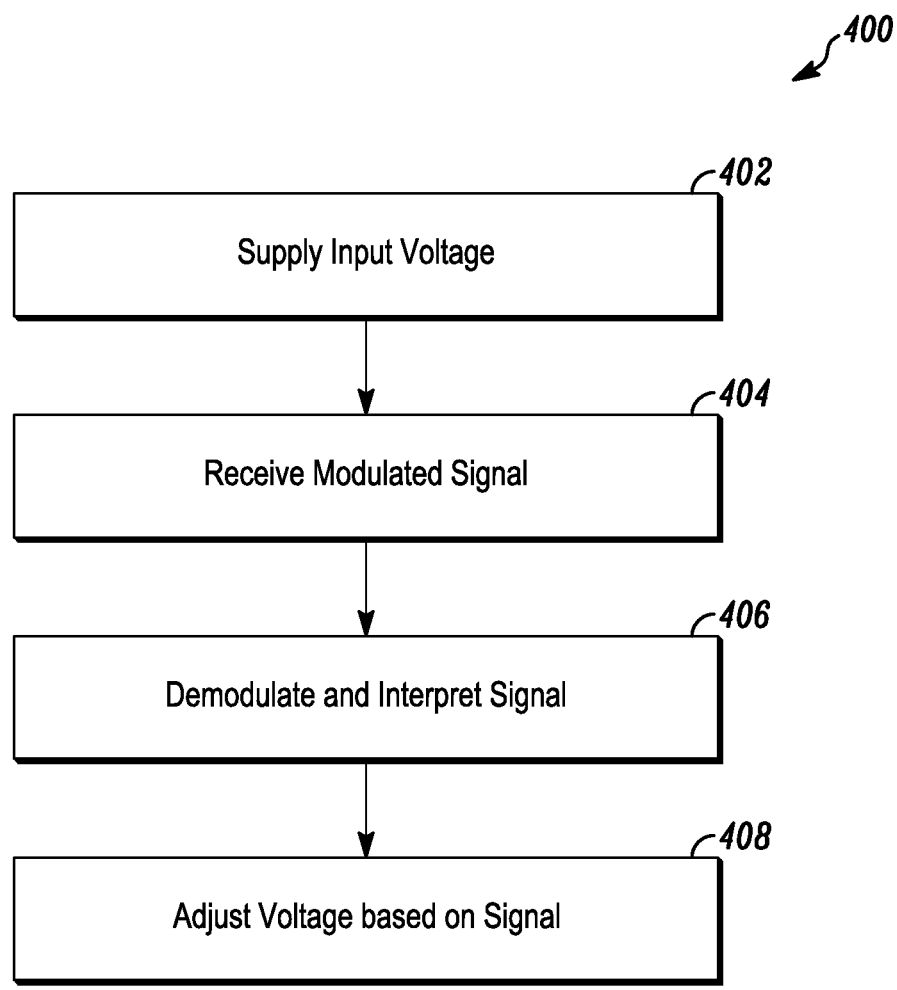
FIG. 4 is a flow diagram of a method in accordance with disclosed embodiments.

FIG. 4 is a flow diagram of a method 400 for adjusting an input voltage provided by a power supply in accordance with disclosed embodiments. As seen in FIG. 4, the method 400 can include a power supply (e.g. the power supply 40) supplying the input voltage to a control panel (e.g. control panel 18) as in 302, the power supply receiving a modulated signal from the control panel as in 304, and the power supply demodulating and interpreting the modulated signal from the control panel as in 306 to interpret a digital value of the modulated signal. Finally, the method 400 can include the power supply adjusting the voltage based on the digital value as in 408.

Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. A method comprising:
receiving an input voltage from a power supply at a control panel of a security system;
measuring the input voltage from the power supply at the control, panel;
determining, at the control panel, whether the input voltage from the power supply is within a range of acceptable input voltages for powering the control panel;
when the input voltage from the power supply is outside of die range of acceptable input voltages for powering the control panel, generating a notification at the control panel; and
when the input voltage from the power supply is outside of the range of acceptable input voltages for powering the control panel, transmitting a modulated signal from the control panel to the power supply on a direct current line between the power supply and the control panel instructing the power supply to increase or decrease the input voltage from the power supply, wherein the power supply is installed at a fuse box within a secured area or at a wall outlet within the secured area.

2. The method of claim 1 wherein the notification includes a pop-up window displayed on a display device of the control panel.

3. The method of claim 2 further comprising:
generating step-by-step instructions to increase or decrease the input voltage from the power supply to be within the range of acceptable input voltages for powering the control panel; and
displaying the step-by-step instructions in the pop-up window.

4. The method of claim 1 wherein the direct current line comprises wiring between the control panel and the power supply.

5. The method of claim 4 wherein the wiring includes preexisting wiring in the secured area.

6. The method of claim 1 further comprising enunciating the notification through a speaker of the control panel.

7. The method of claim 1 further comprising activating a trouble indicator associated with the control panel to visually display the notification.

8. A method comprising:
receiving an input voltage from a power supply at a control panel of a security system;
measuring the input voltage from the power supply at the control panel;
determining, at the control panel, whether the input voltage from the power supply is within a range of acceptable input voltages for powering the control panel; and
when the input voltage from the power supply is outside of the range of acceptable input voltages for powering the control panel, transmitting a modulated signal from the control panel to the power supply on a direct current line between the power supply and the control panel instructing the power supply to increase or decrease the input voltage from the power supply,
wherein the power supply is installed at a fuse box within a secured area or at a wall outlet within the secured area.

9. The method of claim 8 wherein the modulated signal includes a single hit, digital signal that indicates whether the power supply should increase or decrease the input voltage from the power supply.

10. The method of claim 8 wherein the modulated signal instructs the power supply to increase or decrease the input voltage from the power supply by a predetermined amount.

11. The method of claim 10 wherein the predetermined amount is 100 mV.

12. The method of claim 8 wherein the modulated signal includes a multiple bit, digital signal that indicates whether the power supply should increase or decrease the input voltage from the power supply and an amount by which the power supply should increase or decrease the input voltage from the power supply.

13. The method of claim 12 further comprising generating the multiple bit, digital signal via a plurality of modulations on the direct current line.

14. The method of claim 8 further comprising generating a notification to display on a display device of the control panel indicating a failure to increase or decrease the input voltage from the power supply to be within the range of acceptable input voltages for powering the control panel.

15. The method of claim 14 further comprising:
generating step-by-step instructions to increase or decrease the input voltage from the power supply to be within the range of acceptable input voltages for powering the control panel; and
displaying the step-by-step instructions on the display device.

16. A system comprising:
a power supply;
a control panel; and
a direct current line coupled between the power supply and control panel,
wherein the control panel receives an input voltage provided by the power supply,
wherein the control panel measures the input voltage provided by the power supply,
wherein the control panel determines whether the input voltage provided by the power supply is within a range of acceptable input voltages for powering the control panel, and
wherein, when the input voltage from the power supply is outside of the range of acceptable input voltages for powering the control panel, the control panel transmits a modulated signal to the power supply on the direct current line instructing the power supply to increase or decrease the input voltage provided by the power supply, and
wherein the power supply is installed at a fuse box within a secured area or at a wall outlet within the secured area.

17. The system of claim 16 wherein the modulated signal includes a single bit, digital signal that indicates whether the power supply should increase or decrease the input voltage provided by the power supply.

18. The system of claim 16 wherein the modulated signal instructs the power supply to increase or decrease the input voltage provided by the power supply by a predetermined amount.

19. The system of claim 18 wherein the predetermined amount, is 100 mV.

20. The system of claim 16 wherein the modulated signal includes a multiple bit, digital signal that indicates whether the power supply should increase or decrease the input voltage provided by the power supply and an amount by which the power supply should increase or decrease the input voltage provided by the power supply, and wherein the multiple bit, digital signal is generated via a plurality of modulations on the direct current line.

* * * * *